United States Patent
Jones et al.

(10) Patent No.: US 7,361,588 B2
(45) Date of Patent: Apr. 22, 2008

(54) ETCH PROCESS FOR CD REDUCTION OF ARC MATERIAL

(75) Inventors: Phillip L. Jones, Fremont, CA (US); Mark S. Chang, Los Altos, CA (US); Scott A. Bell, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 375 days.

(21) Appl. No.: 11/098,049

(22) Filed: Apr. 4, 2005

(65) Prior Publication Data

US 2006/0223305 A1   Oct. 5, 2006

(51) Int. Cl.
*H01L 21/4763* (2006.01)

(52) U.S. Cl. .................. 438/636; 438/694; 438/736; 257/E21.026; 257/E21.039

(58) Field of Classification Search ................ 438/639, 438/725, 947, 952, 736, 695, 696, 636; 216/37, 216/49; 257/E21.026, E21.029, E21.039; 977/855

See application file for complete search history.

(56) References Cited

U.S. PATENT DOCUMENTS

| | | | |
|---|---|---|---|
| 5,264,076 A | 11/1993 | Cuthbert et al. | |
| 5,773,199 A | 6/1998 | Linliu et al. | |
| 5,837,428 A | 11/1998 | Huang et al. | |
| 5,858,621 A | 1/1999 | Yu et al. | |
| 6,028,001 A * | 2/2000 | Shin | 438/640 |
| 6,080,678 A | 6/2000 | Yim | |
| 6,096,659 A | 8/2000 | Gardner et al. | |
| 6,136,679 A | 10/2000 | Yu et al. | |
| 6,156,629 A | 12/2000 | Tao et al. | |
| 6,218,292 B1 | 4/2001 | Foote | |
| 6,221,776 B1 | 4/2001 | Smith | |
| 6,297,170 B1 | 10/2001 | Gabriel et al. | |
| 6,252,922 B1 | 3/2002 | Kim | |
| 6,365,529 B1 | 4/2002 | Hussein et al. | |
| 6,410,421 B1 | 6/2002 | Ghandehari et al. | |
| 6,579,808 B2 * | 6/2003 | Cho et al. | 438/725 |
| 6,774,032 B1 | 8/2004 | Park | |
| 6,955,961 B1 * | 10/2005 | Chung | 438/241 |
| 2004/0065956 A1 * | 4/2004 | Teh et al. | 257/751 |
| 2004/0157381 A1 * | 8/2004 | Seo | 438/142 |
| 2005/0056823 A1 | 3/2005 | Allen et al. | |

FOREIGN PATENT DOCUMENTS

EP   1 460 677 A2   9/2004

OTHER PUBLICATIONS

International Search Report and Written Opinion for Application No. PCT/US2006/010231, mailed Aug. 8, 2006, received Sep. 1, 2006, 7 pages.

* cited by examiner

*Primary Examiner*—Caridad Everhart
(74) *Attorney, Agent, or Firm*—Foley & Lardner LLP

(57) ABSTRACT

A method of reducing critical dimensions of a feature in a anti-reflective coating layer structure can utilize a polymerizing agent. The anti-reflective coating structure can be utilized to form various integrated circuit structures. The anti-reflective coating can be utilized to form gate stacks comprised of polysilicon and a dielectric layer, conductive lines, or other IC structure. The polymerizing agent can include carbon, hydrogen and fluorine.

20 Claims, 10 Drawing Sheets

US 7,361,588 B2

ETCH PROCESS FOR CD REDUCTION OF ARC MATERIAL

FIELD OF THE INVENTION

The present specification relates to the fabrication of integrated circuits (ICs). More specifically, the present specification relates to a critical dimension (CD) reduction process for forming integrated circuit features.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of devices on an IC, there is still a need to decrease the size of IC device features, and, thus, increase the number of devices on an IC.

One limitation to the smallness of IC critical dimensions is conventional lithography. In general, projection lithography refers to processes for pattern transfer between various media. According to conventional projection lithography, a silicon slice, the wafer, is coated uniformly with a radiation-sensitive film or coating, the photoresist. An exposing source of radiation illuminates selected areas of the surface through an intervening master template, the mask or reticle, for a particular pattern. The radiation can be light, such as ultra-violet light, vacuum ultra-violet (VUV) light and deep ultraviolet light. The radiation can also be x-ray radiation, e-beam radiation, etc.

The traditional way to reduce critical dimensions is to rely on improvements to the lithographic process. Such improvements can be time consuming and expensive, often requiring expensive new equipment. Even if a lithographic improvement is possible, a lithographic CD shrink is often accompanied by a rise in defect densities.

According to one conventional non-lithographic CD shrink process, mask layers have been subject to spacer etching processes to shrink lithographic features. These spacer etching processes usually utilize spacer materials composed of oxide or nitride material. The spacer materials are typically deposited and etched around compatible material layers, such as, polysilicon gates or nitride/oxide hardmasks.

An anti-reflective coating (ARC) has been conventionally provided underneath the photoresist material or the hard mask to reduce reflectivity and thereby, reduce resist notching, lifting and variation of critical dimension of the obtained pattern. Generally, the ARC (organic or inorganic) layer is a relatively thin layer which is not used as a hard mask because it is too thin and does not allow thickness flexibility due to optical design parameters. Conventional spacer etching processes generally have not been used with organic ARC layers due to material incompatibility issues associated with oxide and nitride spacer processes.

Thus, there is a need to shrink CD features using non-conventional polymerizing etch techniques. Further, there is a need for a process of forming smaller CD dimension that etches an ARC layer step. Yet further, there is a need for an organic ARC process that reduces CD size by etching. Even further still, there is a need for an etch recipe that effectively reduces CD size of ARC features. Yet further still, there is a need to reduce the CD or final inspected critical dimension (FICD) of an organic polymer spacer material by using a polymerizing gas additive to an established organic ARC etch process.

SUMMARY OF THE INVENTION

An exemplary embodiment relates to a method of fabricating an integrated circuit. The method includes providing an anti-reflective coating layer above a substrate, providing a photoresist layer above the anti-reflective coating layer, and patterning the photoresist. The method also includes removing the anti-reflective coating layer in accordance with a first feature defined by the photoresist layer. The removing includes providing a polymerizing gas. The feature in the anti-reflective coating layer has a reduced critical dimension.

Another exemplary embodiment relates to a method of fabricating an integrated circuit. The method includes providing an organic anti-reflective coating, and plasma dry etching the anti-reflective coating in accordance with a feature. The feature defines a spacing. The plasma dry etching includes providing a polymerizing agent. The spacing in the anti-reflective coating has a reduced critical dimension.

Yet another embodiment relates to a method of forming a spacing for an integrated circuit. The method includes steps of providing an organic coating above a substrate or layer above a substrate, patterning a photoresist layer above the organic coating, and selectively removing the organic coating in accordance with the feature. The coating is removed using a polymerizing agent.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 1:
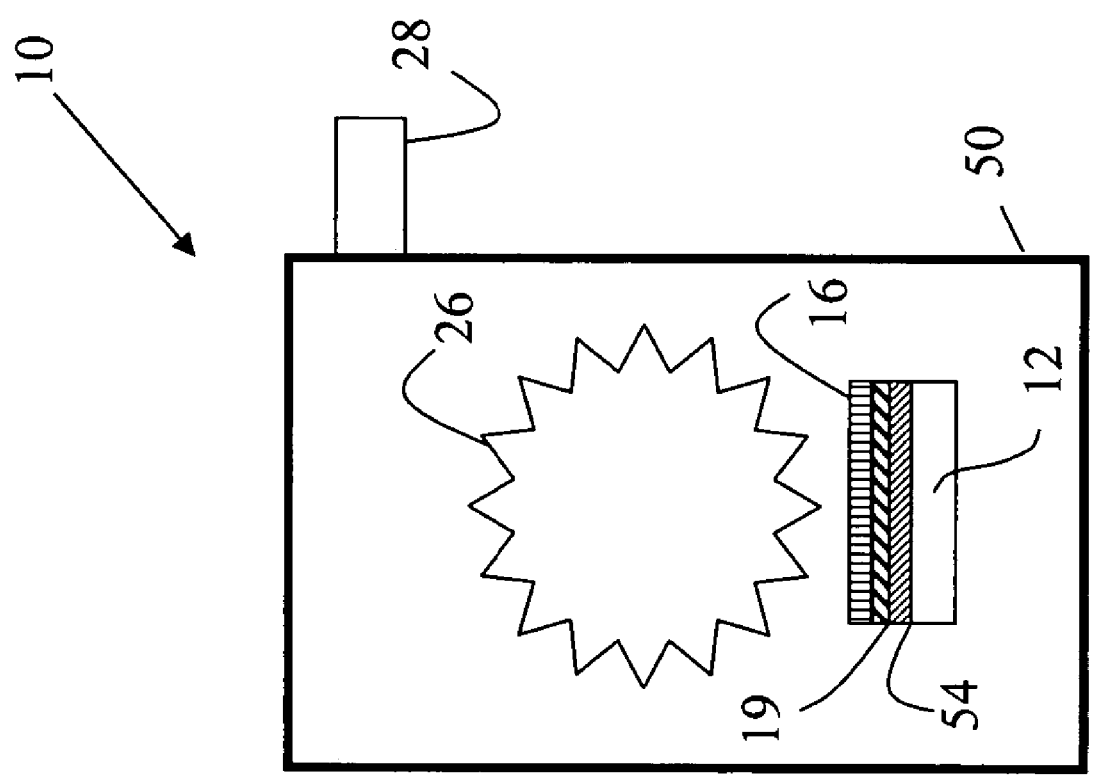
FIG. 1 is a general schematic block diagram of an etching system for processing an integrated circuit wafer according to an exemplary embodiment.

Referring to FIG. 1, a substrate 12 is shown in an etching system 10. Substrate 12 can be a semiconductor substrate, such as, silicon, gallium arsenide, germanium, or other substrate material. Substrate 12 can include one or more layers of material thereon. The layers can be insulative layers, conductive layers, barrier layers, or other layers of material which are to be etched, or selectively removed using the process described herein.

Substrate 12 can include one or more layers of material and/or features, such as, lines, interconnects, vias, doped portions, etc., and can further include devices, such as, transistors, microactuators, microsensors, capacitors, resistors, diodes, etc. Substrate 12 can be an entire IC wafer or part of an IC wafer. Substrate 12 can be part of an integrated circuit, such as, a memory, a processing unit, an input/output device, etc.

Etching system 10 is preferably a dry etching system for forming features on substrate 12 or layers above substrate 12 in accordance with lithographic patterns. System 10 can include a chamber 50. In one embodiment, system 10 is a plasma dry etching system that utilizes a plasma 26 to etch substrate 12 and/or layers above substrate 12 (e.g., layer 52). Chamber 50 can include one or more gas input 28 for receiving etching gasses. Chamber 50 can contain any of numerous types atmospheres. Preferably, system 10 can receive several species of gasses at selected energies, temperatures, pressures, and flow rates. The configuration of system 10 shown in FIG. 1 is exemplary.

In one embodiment, the layers above substrate 12 are a dielectric layer and a gate conductor layer (such as layer 52) used to form a gate stack. The dielectric layer can be a gate oxide and the gate conductor layer can be polysilicon or metal. The gate stack is configured using the process described below. In another embodiment, the layers above substrate 12 can be conductive layers for conductive lines and interlevel dielectric layers. Various integrated circuit features may be fabricated using the method described below.

Substrate 12 and subsequent layers of material are not described in a limiting fashion. The principles of the present invention can be applied to any integrated circuit substrate, wafer, mask layer, or other layer. Substrate 12 can be conductive, semiconductive, or insulative.

A layer of lithographic material, such as, a photoresist layer or material 16 is deposited or applied over an antireflective coating (ARC) layer 19. In one embodiment, anti-reflective coating layer 19 can be an organic ARC material provided above layer 54 or substrate 12. Layer 54 is preferably doped, implanted or etched in accordance with layers 16 and 19. Layer 19 preferably serves as a mask for subsequent etching of layers above substrate 12 or layers above substrate 12 (such as layer 14) as well as a coating for optically enhancing resolution by reducing reflections. Thickness and materials for layer 19 is chosen to be thin enough to be etched without eroding material 16 and yet thick enough to provide critical dimension control and to withstand the etching of layers underneath layer 19.

Photoresist material 16 can comprise any of a variety of photoresist chemicals suitable for lithographic applications. Material 16 can be comprised of a matrix material or resin, a sensitizer or inhibitor, and a solvent. Photoresist material 16 is preferably a high-contrast photoresist, but may alternatively be a low-contrast photoresist.

Photoresist material 16 is deposited by, for example, spin-coating over layer of structure 14. Material 16 can be provided with a thickness of less than 0.5 microns. Preferably, photoresist material 16 has a thickness between 0.1 and 0.05 microns. Further, photoresist material 16 may be either a positive photoresist or a negative photoresist and can be a multilayer resist material. The type and structure of lithography and photoresist material 16 is not exemplary only.

Figure 2:
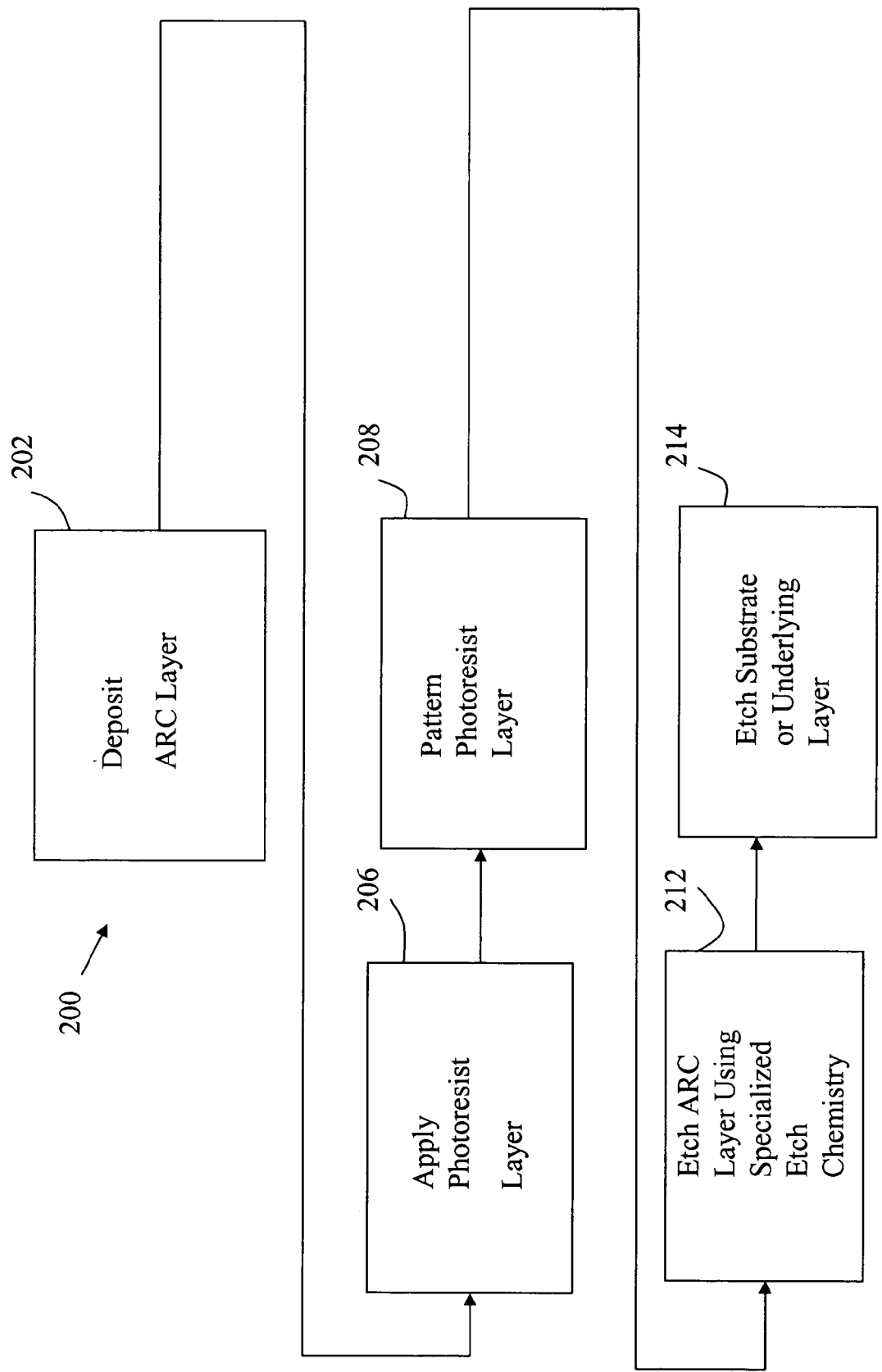
FIG. 2 is flow diagram showing an anti-reflective coating layer etching process for a substrate or a layer above a substrate.

With reference to FIGS. 1-10, an exemplary process for forming a gate stack or structure is described below as follows. With reference to FIG. 2, flow diagram 200 describes a process of forming a reduced critical dimension (CD) feature in an antireflective coating (ARL) layer. Process 200 advantageously provides a mask that can be etched to produce critical dimension reduction control. Process 200 simplifies manufacturing and reduces manufacturing costs and yet improves density. Process 200 improves precision associated with critical dimensions.

Process 200 advantageously copes with the increasing demand of continual CD shrink requirements by adding a polymerizing gas additive to a standard organic antireflective coating (ARC) etch process. By adding polymerizing gas additives in the correct quantity, a significant shrinkage of the final inspect critical dimension (FICD) can be achieved while still maintaining required vertical organic ARC profiles. The polymerizing agent or gas can be added as a gas mixture with a conventional BARC etch chemistry at input assembly 28 of chamber 50.

Relying on a polymerizing etch process to shrink the CD is a cheaper, simpler, and more robust solution because it can be used with current process equipment using well established, less costly lithographic technology. Advanced lithographic equipment is quite costly, and changes in equipment can require additional changes to the process as well as additional process testing.

Process 200 is preferably advantageously used to provide spaces (or alternatively, apertures, trenches, etc.) between lines or other features. In one embodiment, the spaces are the feature having the critical dimension. The spaces are shrunk by growing the material on the lateral sidewalls of ARC layer 19 during the etching process. Applicants have paradoxically found a way to grow material on lateral sidewalls during the etching process, thereby shrinking the spaces or holes in the pattern at the same time material is removed to form the pattern.

Process 200 can be utilized for bit lines, gate conductors, or any area in which ARC (e.g. layer 19) is utilized. The advantageous process 200 reduces the space dimension (e.g., the dimension between lines, conductors or other structures). In one preferred embodiment, process 200 utilizes a dry etch, such as, a plasma dry etch using ion bombardment, to remove the ARC layer 19 that is not directly underneath photoresist material 16. A polymerizing agent utilized during the etching causes horizontal growth of ARC layer 19, thereby shrinking the critical dimension.

In one embodiment, the polymerizing agent can be a polymerizing gas, such as $CH_3F$, $CH_2F_2$, or $CHF_3$. However, process 200 is not limited to the specific species of polymerizing agents. In one embodiment, the flow of the polymerizing gas is tightly controlled. An excessive flow of the polymerizing agent results in an etch stop condition while too slight of flow of the polymerizing agent results in only marginal reduction of FICD. Applicants have found that a careful optimization of the polymerizing agent into an organic ARC etch process can result in a 10-20 nanometer reduction in CDs, while still maintaining vertical organic ARC photoresist.

According to one embodiment, polymerizing agent ($CH_3F$ at 10 sccm) added to a conventional 75 $CF_4$/25 HBr BARC etch chemistry results in a CD shrinkage of 20 nm from an original 90 nanometers. The use of the polymerizing agent results in comparable defect densities when compared to the original non-$CH_3F$ BARC process.

According to one example, applicants have found that use of a polymerizing agent of $CH_3F$ to a conventional organic bottom antireflective coating (BARC) etch process at approximately 10 standard cubic centimeters per minute (sccm) (9% of feed stock) results in a CD reduction of 20 nanometers. Applicant has also found that the incorporation of 12 sccm of the polymerizing agent results in a CD reduction of 30 nanometers. Applicants have further found that the incorporation of 15 sccm or more into the feed stock results in an etch stop condition.

System criteria and application parameters can affect the optimization of conditions for the introduction of the polymerizing agent. For example, the percentage of polymerizing gas needed to reach appropriate transmission can be dependent on the C/F ratio of the polymerizing agent selected. The use of $CH_2F_2$ instead of $CH_3F$ as a polymerizing gas results in less of a CD reduction as a function of the percentage of feed gas. Further, the type of ARC material, its thickness, temperature, pressure and energy levels can affect the conditions for introduction of the polymerizing agent. For example, higher temperatures can reduce the growth rate on the ARC layer, and higher pressure can increase the growth rate on the ARC layer.

Process 200 is described in more detail with respect to FIG. 2 as follows. At a step 202, an anti-reflective coating (ARC) layer, such as layer 19 is deposited above substrate 12. ARC layer 21 is preferably an organic ARC layer as discussed below with reference to FIG. 3. As discussed above, the materials and thickness of ARC layer 19 can be chosen to have superior optical properties. Layer 19 can also be a compound or composite layer of several ARCS.

At a step 206, a photoresist layer is applied over the ARC layer (layer 19). The photoresist layer can be photoresist material 16 (FIG. 1). At a step 208, the photoresist layer is patterned in a lithographic system. Any patterning technique can be utilized.

At a step 212, ARC layer 19 is etched in accordance with pattern photoresist material 16. Preferably, ARC layer 19 is etched in accordance with a conventional ARC etching chemistry, however a polymerizing agent is added to the gas mixture. In one embodiment, dry plasma etching is utilized with a polymerizing agent including carbon, hydrogen, and fluorine. The use of the polymerizing agent in combination with the plasma causes horizontal growth on lateral sidewalls of layer 19. The horizontal growth reduces the critical dimension associated with the spacing of the pattern in photoresist material 16. ARC layer 19 can be utilized as mask for forming integrated circuit structures such as gate stacks, contacts, conductive lines, or other IC structure. Preferably layers 16 and 19 are utilized together as a mask for etching underlying layers or substrates.

At a step 214, the underlying layer (layer 52) or substrate 12 is etched using material 16 and layer 19 as a pattern. The spacing is reduced due to the use of the polymerizing agent. The present invention is not limited to the type of IC structure formed unless specifically recited in the claims.

Figure 3:
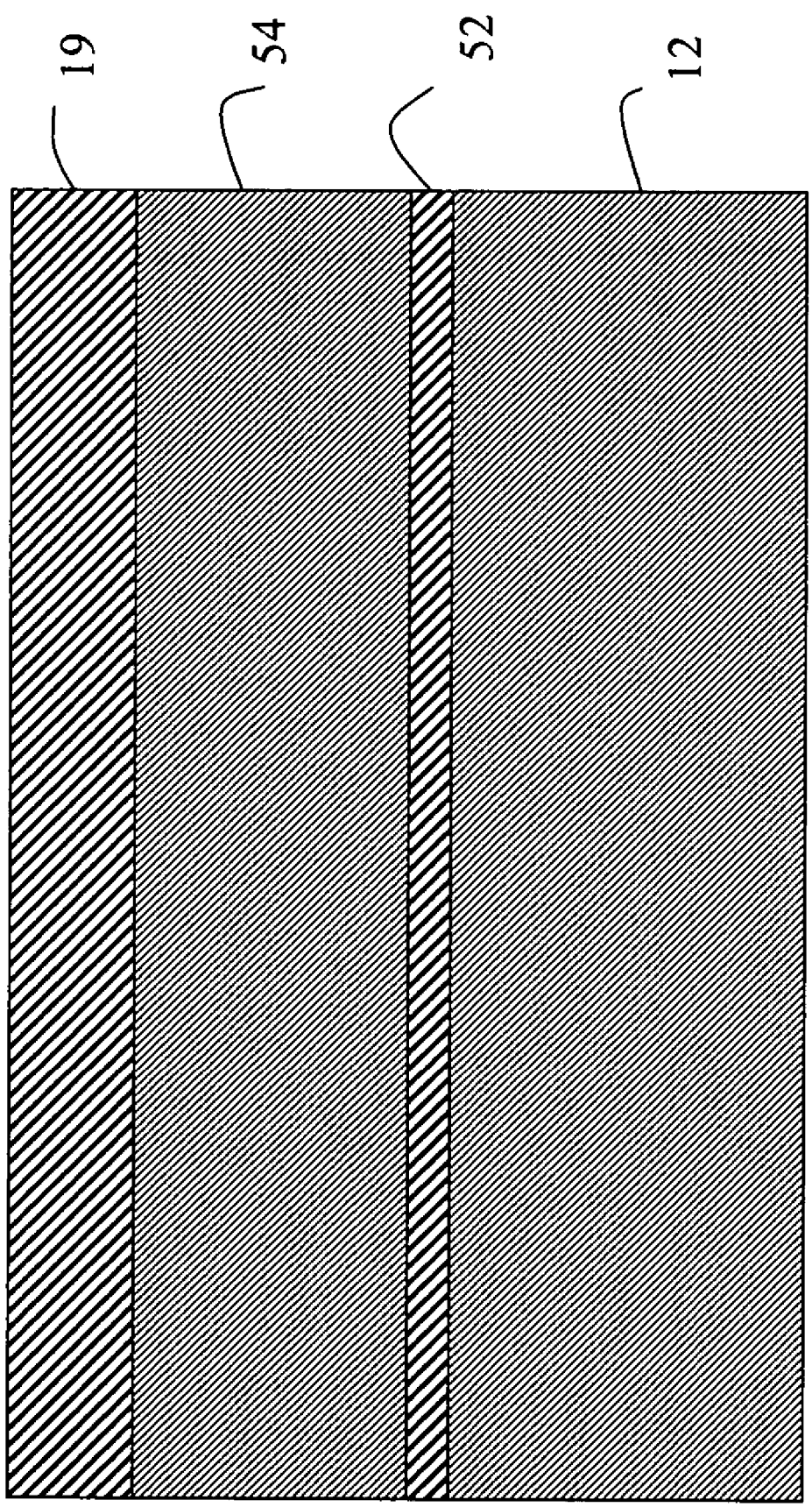
FIG. 3 is a schematic-cross-sectional view of the substrate illustrated in FIG. 1, showing an anti-reflective coating layer deposition step in accordance with an exemplary embodiment of the process illustrated in FIG. 2.

With reference to FIG. 3, substrate 12 includes a dielectric layer 52 and a gate conductor layer 54. Layers 52 and 54 are a conductive/dielectric stack for the formation of a gate structure. Layers 52 and 54 can have a variety of thicknesses and be manufactured from a variety of materials. In one embodiment, gate conductor layer 54 is a 500-2000 Å thick polysilicon layer and layer 52 is a 5-20 Å thick silicon dioxide or silicon nitride layer. Layer 54 can be deposited by chemical vapor deposition (CVD) above layer 52. Layer 52 can be grown or deposited (CVD) above substrate 12.

Figure 9:
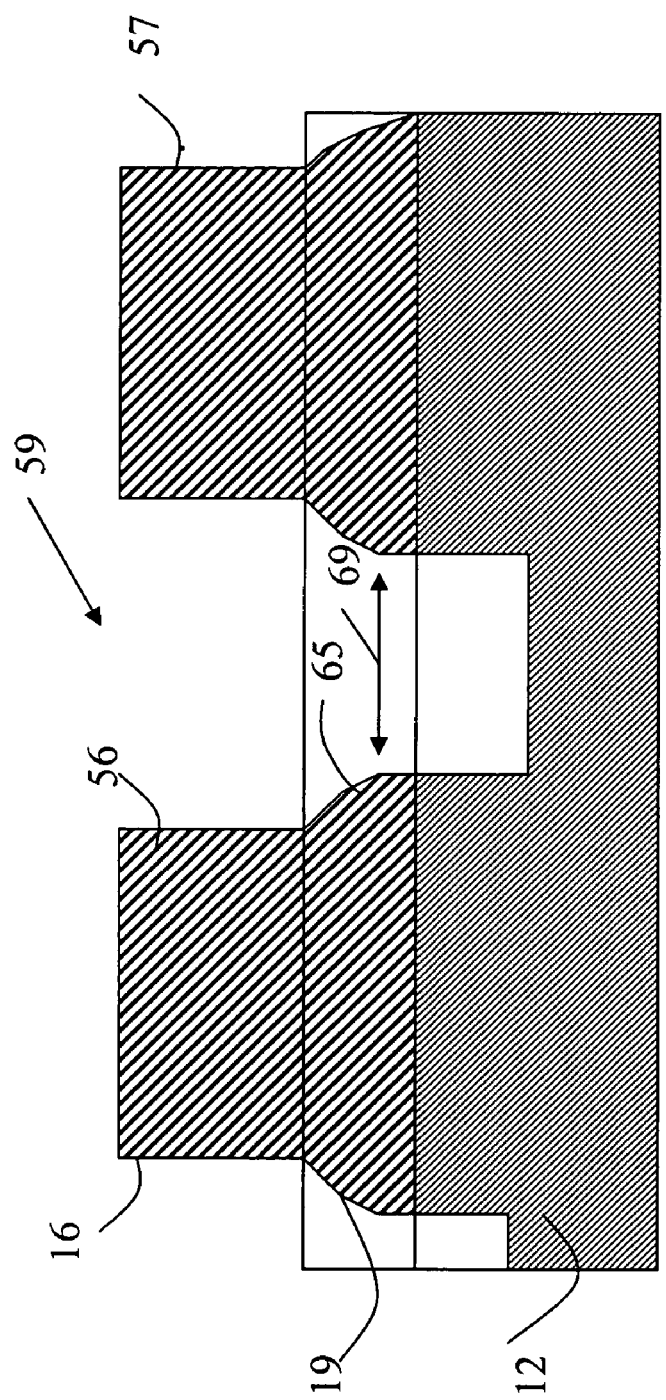
FIG. 9 is a schematic cross-sectional view of the substrate illustrated in FIG. 1, showing a substrate etching step in accordance with an exemplary embodiment of the process illustrated in FIG. 2.

Alternatively, layers 52 and 54 can be any type of layer used in IC fabrication. Layers 52 and 54 are merely examples of additional layers provided above substrate 12. In another alternative, layer 19 is provided above substrate 12 and is used to form features in substrate 12. (FIG. 9). In yet another embodiment, layer 19 is provided above a metal layer 82 and is used to form conductive lines.

An anti-reflective coating layer 19 is provided above layer 54 (step 202) of process 200. Anti-reflective coating layer 19 can be deposited by CVD. In one embodiment, layer 19 is deposited as a 350-400 Å thick layer of organic ARC material (e.g., AR10 or AR30). The thickness of layer 19 is chosen in accordance with optical parameters associated with lithography.

Figure 4:
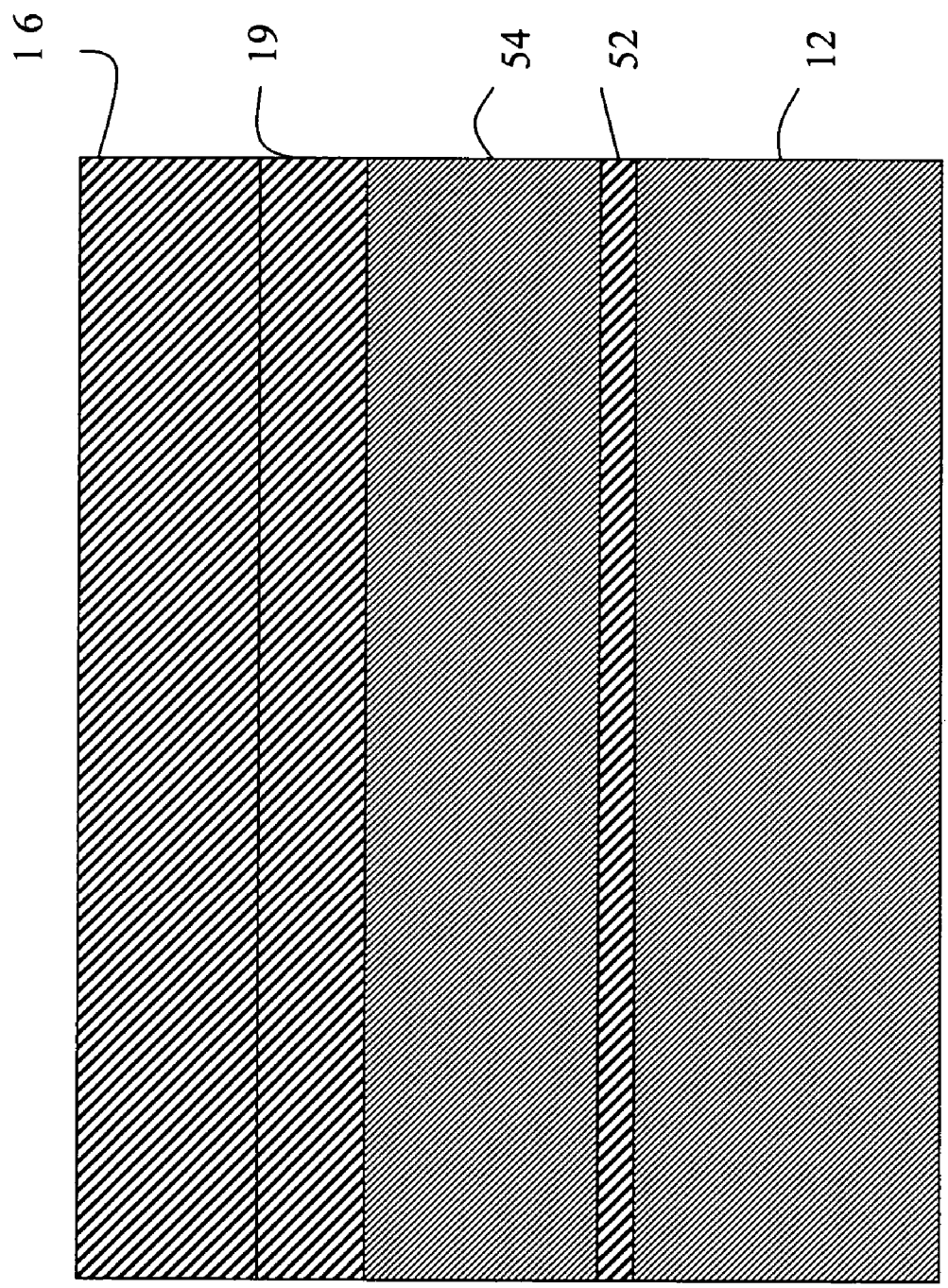
FIG. 4 is a schematic cross-sectional view of the substrate illustrated in FIG. 3, showing a photoresist layer application step in accordance with an exemplary embodiment of the process illustrated in FIG. 2.

With reference to FIG. 4, a layer of photoresist material 16 is applied above layer 19 (step 206 of process 200). Material 16 can be applied by spin coating to a thickness of 100-50000 Å. Photoresist material 16 can be applied or deposited in various conventional processes.

Figure 5:
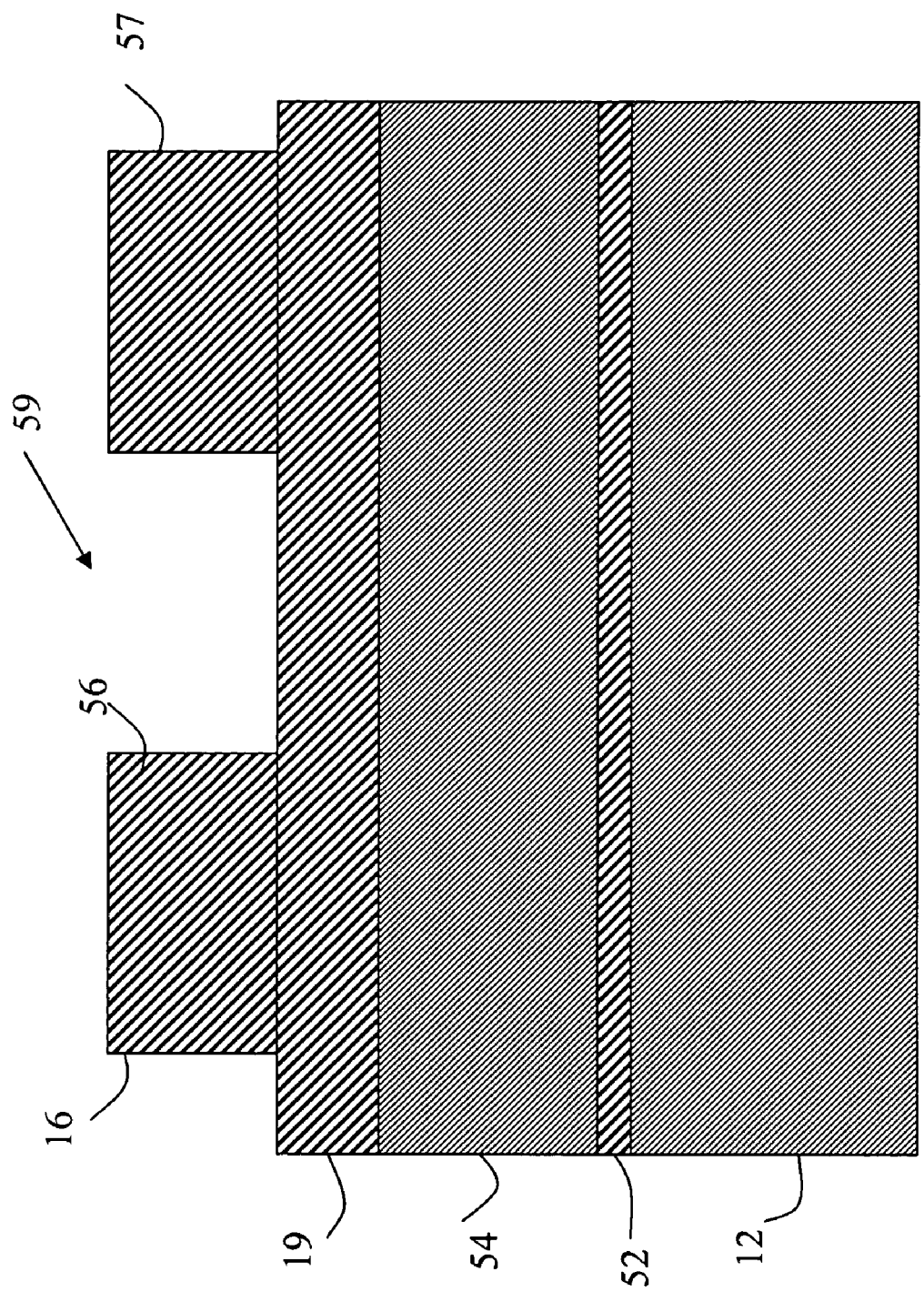
FIG. 5 is a schematic cross-sectional view of the substrate illustrated in FIG. 4, showing a photoresist patterning step in accordance with an exemplary embodiment of the process illustrated in FIG. 2.

With reference to FIG. 5, photoresist material 16 is configured to have a feature 56 according to a conventional lithographic process (step 208 of process 200). The lithographic process advantageously utilizes the anti-reflective characteristics of layer 19.

In one embodiment, radiation is utilized to pattern feature 56 in material 16. After exposure to radiation, material 16 is developed to leave features 56 and 57. Features 56 and 57 are separated by a spacing 59.

Figure 6:
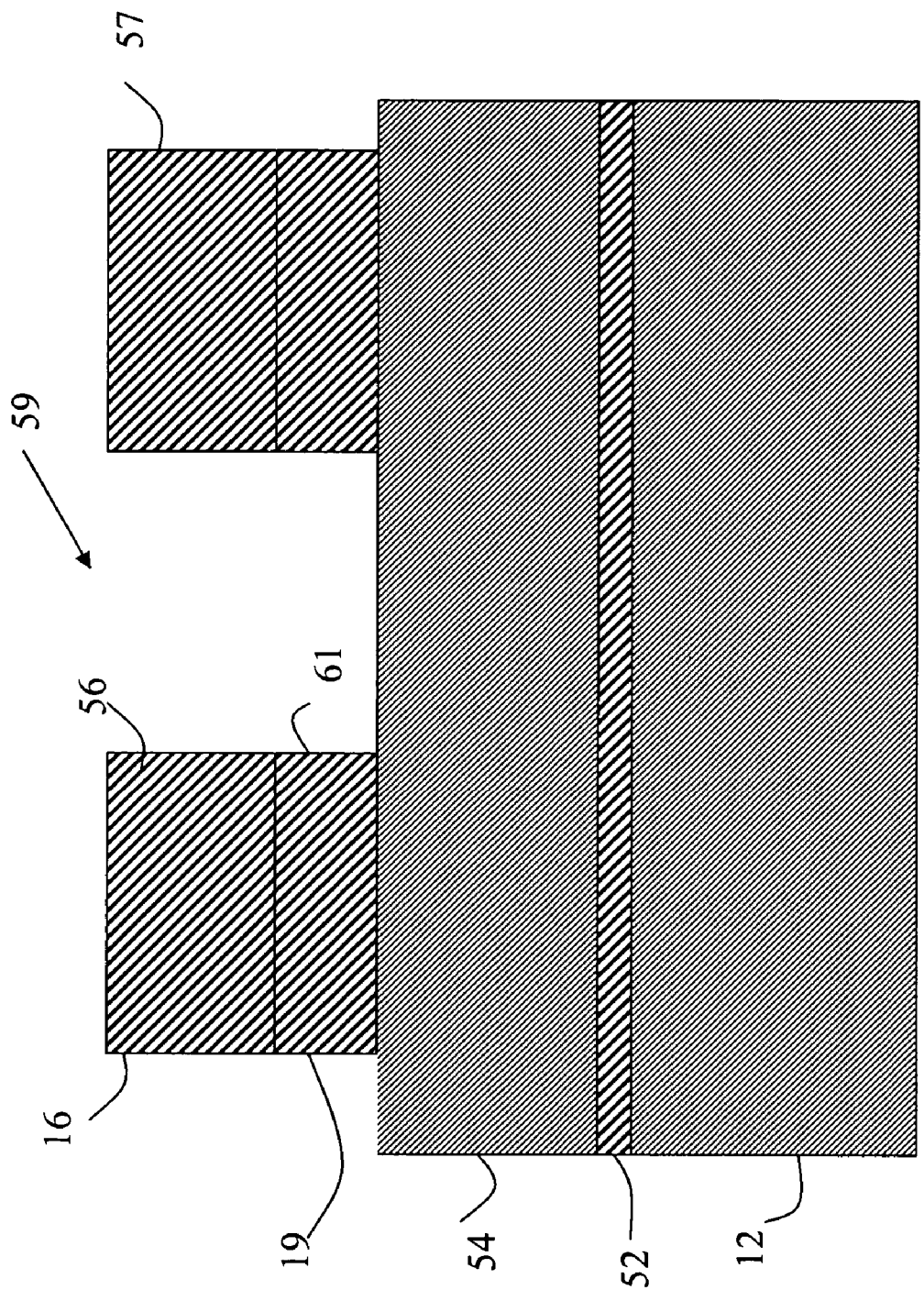
FIG. 6 is a schematic cross-sectional view of the substrate illustrated in FIG. 5, showing etching of the anti-reflective coating layer in accordance with an exemplary embodiment of the process illustrated in FIG. 2.

With reference to FIG. 6, layer 19 is removed in accordance with feature 16. Preferably, a dry etching process is utilized to remove layer 19. In one embodiment, a plasma dry etching process selective to material 19 with respect to the material of layer 54. Preferably, a conventional BARC etch process is utilized. In one preferred embodiment, an etch chemistry of 75 $CF_4$ 25 HBR is utilized in a plasma etching process. In addition, a polymerizing agent such as $CH_3F$, $C_2$, $HF_2$ or $CH_3F$ is included in the gas mixture (step 214 of process 200).

Figure 7:
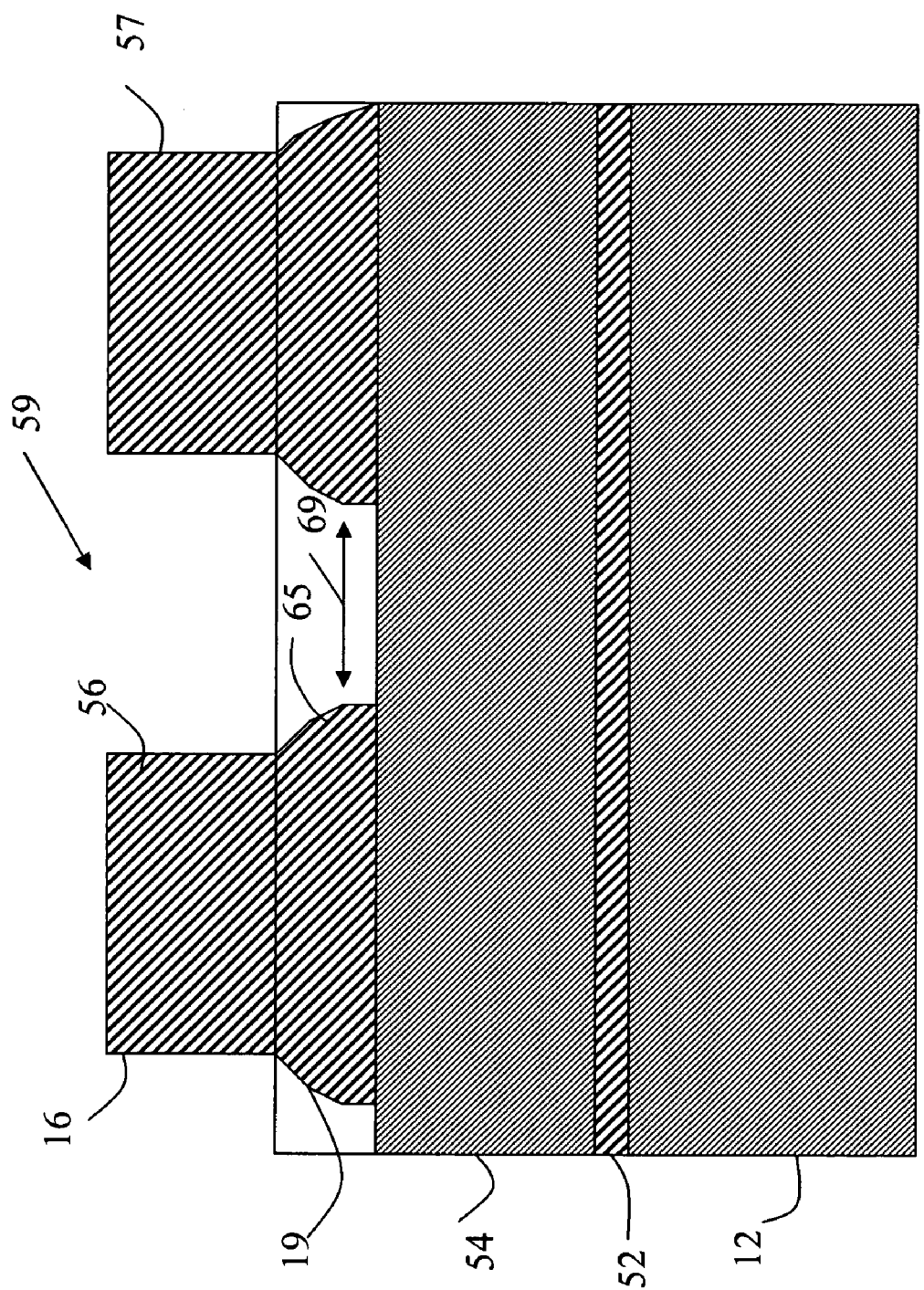
FIG. 7 is a schematic cross-sectional view of the substrate illustrated in FIG. 6, showing growth on lateral sidewalls of the anti-reflective coating layer in accordance with an exemplary embodiment of the process illustrated in FIG. 2.
Figure 8:
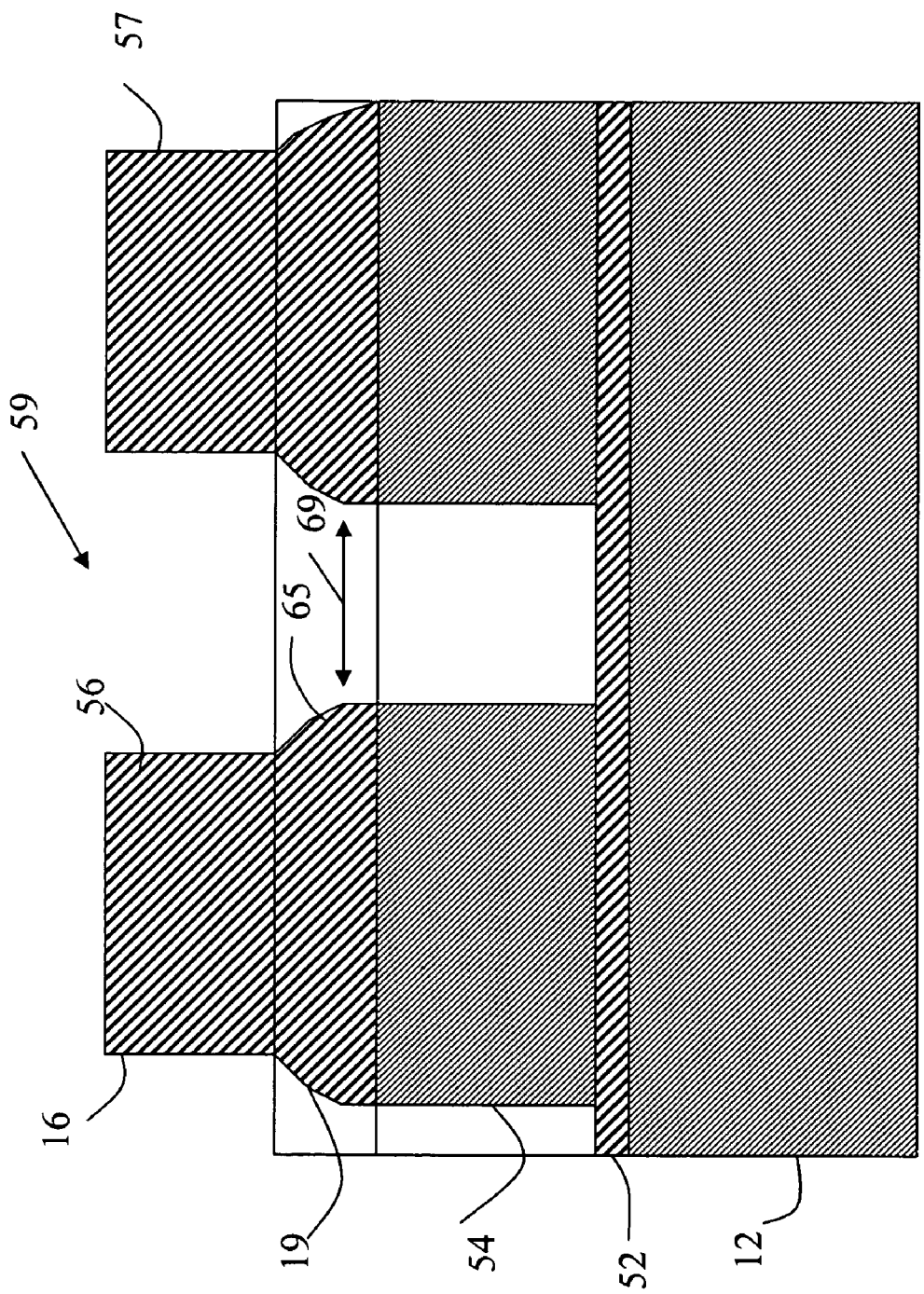
FIG. 8 is a schematic cross-sectional view of the substrate illustrated in FIG. 7, showing a layer etching step in accordance with an exemplary embodiment of the process illustrated in FIG. 2.

With reference to FIG. 7, when layer 19 is etched in accordance with material 16, the dry etching process including the polymerizing agent reduces the critical dimension of spacing 59. As shown, dimension 69 is smaller than the dimension associated with spacing 59. Material 65 is grown on the sidewalls 61 (FIG. 6) of layer 19 to reduce dimension 69. With reference to FIG. 8, layer 54 is etched in accordance with layer 19 and includes a spacing having a dimension associated with dimension 69 of layer 19 (step 214 of process 200).

Figure 10:
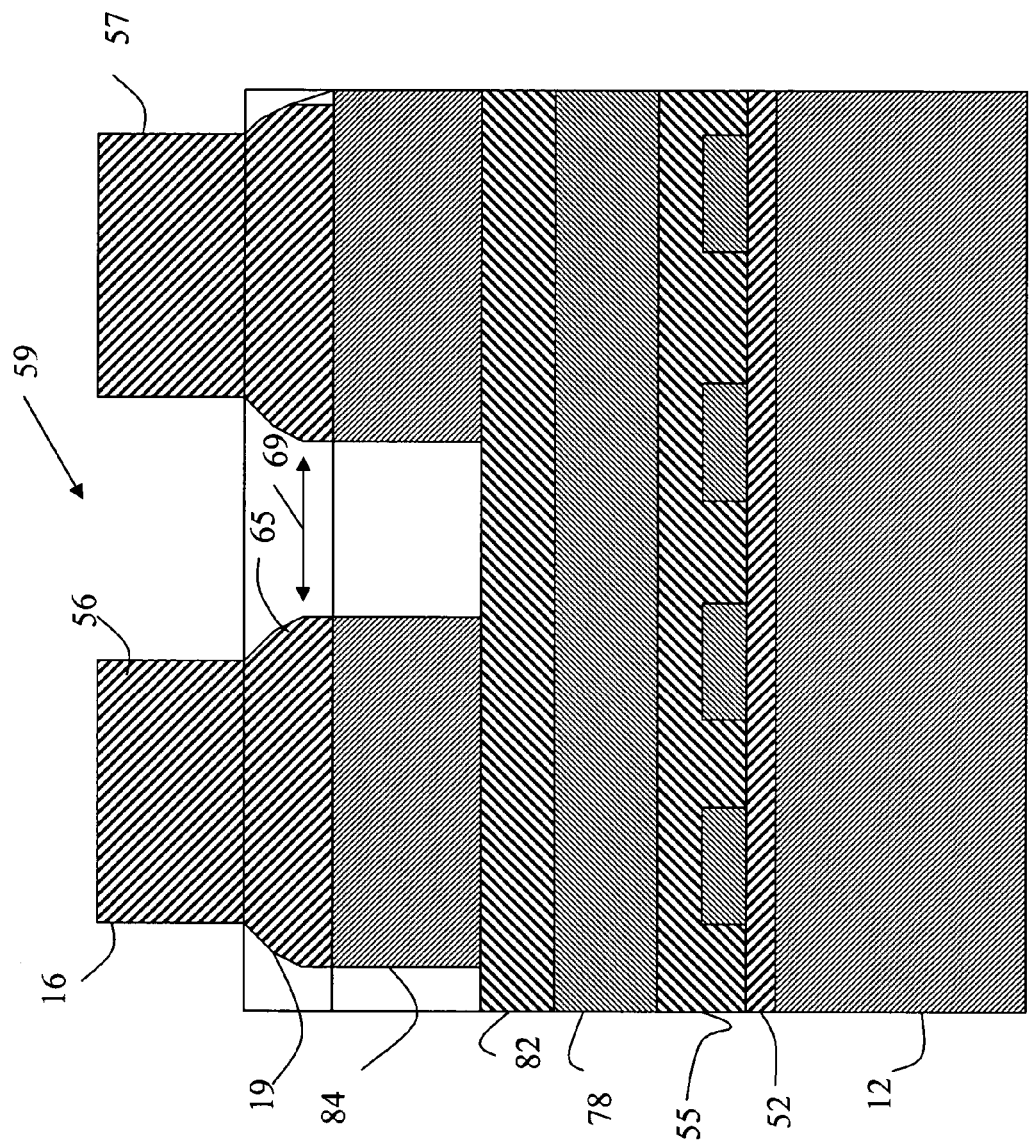
FIG. 10 is a schematic cross-sectional view of the substrate illustrated in FIG. 1, showing a conductive line etching step in accordance with an exemplary embodiment of the process illustrated in FIG. 2.

With reference to FIG. 9, process 200 is utilized to etch substrate 12 using spacing 69. According to this embodiment, layer 19 is provided directly above substrate 12. With reference to FIG. 10, in another embodiment, process 200 is utilized to etch a metal layer 84 above an inter-dielectric layer 82 which is above another metal layer 78. A layer 55 includes transistors. As discussed throughout the application, process 200 can be applied to manufacture any circuit structure in which ARC material is utilized.

Table 1 below provides examples of varying process parameters for etch chemistries for layer 19 as related to showing etching factors.

TABLE I

| | Pressure | Temperature | Energy | Voltage | Chemistry SCCM | Result | EP Time |
|---|---|---|---|---|---|---|---|
| 1. | 15mT | 40° C. | 300 $W_T$ | −325 V | 25HBr/75$CF_4$ (no polymerizing agent) | Good end point/ FICD = 96 nm | 10.7 s |
| 2. | 15mT | 40° C. | 300 $W_T$ | −325 V | 25HBr/75$CF_4$/ 10$CH_3F$ | Good end point/ FICD = 79.1 nm | 20 sec |
| 3. | 15mT | 40° C. | 300 $W_T$ | −325 V | 75$CF_4$/25HBr/ 12$CH_3F$/8THe | Good end point/ FICD = 69 nm | 26 s |
| 4. | 15mT | 40° C. | 300 $W_T$ | −325 V | 75$CF_4$/25HBr/ 12CH2F2/8THe | Good end point/ FICD = 82 nm | 16.3 s |
| 5. | 15mT | 40° C. | 300 $W_T$ | −325 V | 75$CF_4$/25HBr/ 15$CH_3F$/8THe | Etch stop | — |

As shown in Table 1, Examples 2-5 utilize a polymerizing agent. The plasma in each example was monitored to determine when an etch stop condition or an end point condition was reached. If an end point condition was reached, determination of the reduction in spacing was made where possible. In Example 1, the original photoresist spacing was 90 nm and grew to 96 nm. In Example 2, the spacing shrunk from 90 nm to 79.1 nm showing that the polymerizing agent is responsible for a spacing reduction of 10.9 nm. In Example 3, the spacing was decreased from 90 nm to 69 nm. In example 4, the spacing shrunk from 90 nm to 79.1 nm showing that the degree of CD—shrinkage can be modulated by the C/F ratio of the polymerizing agent used. In example, 5 an etch stop condition occurred indicating that a too high polymerization condition can result in an etch stop condition.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of ARC materials and thicknesses processes are mentioned, other materials and process steps can be utilized. Various changes may be made to the details disclosed without departing from the spirit of the invention which is defined by the following claims.

What is claimed is:

1. A method of fabricating an integrated circuit, the method comprising:
   providing an anti-reflective coating layer above a substrate;
   providing a photoresist layer above the anti-reflective coating layer;
   patterning the photoresist layer;
   removing the anti-reflective coating layer in accordance with a first feature defined by the photoresist layer, wherein the removing includes providing HBr, $CF_4$, and a polymerizing gas, whereby the feature in the anti-reflective coating layer has a reduced critical dimension.

2. The method of claim 1, further comprising:
   etching an insulative, conductive or semiconductive layer above the substrate in accordance with the anti-reflective coating layer.

3. The method of claim 2, wherein the reduced critical dimension is a spacing.

4. The method of claim 1, wherein the polymerizing gas includes at least one of the $CH_2F_2$ or $CH_3F$.

5. The method of claim 4, wherein the anti-reflective coating 350-400 Å thick.

6. The method of claim 1, wherein the removing step utilizes a gas mixture including 10 percent of the polymerizing gas.

7. The method of claim 6, wherein the polymerizing gas has a flow rate less than 15 sccm.

8. The method of claim 7, wherein the flow rate is between 7 and 15 sccm.

9. The method of claim 1, wherein the polymerizing gas has a flow rate between 7 and 12 sccm.

10. The method of claim 1, wherein is a spacing and the reduced critical dimension is a width of the spacing.

11. A method of fabricating an integrated circuit, the method comprising:
    providing an organic anti-reflective coating; and
    plasma dry etching the anti-reflective coating in accordance with a feature, the feature defining a spacing, wherein the plasma dry etching includes providing a polymerizing agent in addition to HBr and $CF_4$ gases, whereby the spacing in the anti-reflective coating has a reduced critical dimension.

12. The method of claim 11, wherein the polymerizing agent includes carbon, hydrogen, and flourine.

13. The method of claim 11, wherein the polymerizing agent is provided with a plasma for etching the antireflective coating.

14. The method of claim 11, wherein the polymerizing agent is a gas.

15. The method of claim 14, wherein the polymerizing gas includes $CH_3F$.

16. The method of claim 15, wherein the polymerizing gas is provided at a flow rate of less than 15 sccm.

17. The method of claim 15, wherein the material is grown on sidewalls of the antireflective coating due to the polymerizing agent.

18. A method of forming a spacing for an integrated circuit, the method comprising steps of:
providing an organic coating above a substrate or a layer above a substrate;
patterning a photoresist layer above the organic coating; and
selectively removing the organic coating in accordance with a feature, the coating being removed using a polymerizing agent in combination with HBr and $CF_4$ gases.

19. The method of claim 18, wherein the polymerizing agent includes at least one of $CH_2F_2$, $CHF_3$, and $CH_3F$.

20. The method of claim 18, wherein the selectively removing step utilizes a gas mixture including a conventional ARC removal etchant and the polymerizing agent, wherein the polymerizing agent is 10% of the gas mixture.

* * * * *